United States Patent [19]

Seidler

[11] Patent Number: 5,139,448
[45] Date of Patent: Aug. 18, 1992

[54] SOLDER-BEARING LEAD

[75] Inventor: Jack Seidler, Flushing, N.Y.

[73] Assignee: North American Specialties Corporation, Flushing, N.Y.

[21] Appl. No.: 687,587

[22] Filed: Apr. 16, 1991

Related U.S. Application Data

[63] Continuation-in-part of Ser. No. 416,505, Oct. 3, 1989, Pat. No. 5,052,954, which is a continuation of Ser. No. 129,715, Dec. 7, 1987, Pat. No. 4,883,435.

[51] Int. Cl.⁵ .............................................. H01R 4/02
[52] U.S. Cl. ................................... 439/876; 29/860; 29/874
[58] Field of Search ............... 29/876, 860, 878, 879, 29/854; 439/874-876, 80-83

[56] References Cited

U.S. PATENT DOCUMENTS

| | | | |
|---|---|---|---|
| 4,120,558 | 10/1978 | Seidler | 439/876 |
| 4,605,278 | 8/1986 | Seidler | 439/876 |
| 4,679,889 | 7/1987 | Seidler | 439/876 |
| 4,697,865 | 10/1987 | Seidler | 439/876 |
| 4,737,115 | 4/1988 | Seidler | 439/876 |
| 4,780,098 | 10/1988 | Seidler | 439/876 |
| 4,883,435 | 11/1989 | Seidler | 439/876 |

Primary Examiner—David L. Pirlot
Attorney, Agent, or Firm—Darby & Darby

[57] ABSTRACT

A solder-bearing lead for attachment to the surface of a substrate, wherein a discrete mass of solder is mechanically held firmly by the lead in a position permitting close proximity to the substrate surface to connect the lead to the substrate with an electrical and mechanical bond upon melting of the solder, the lead body having a pair of fingers partially encircling the solder mass with a gap between the fingers providing an unobstructed flow for the melted solder to the substrate. The lead may also be used to interconnect a first substrate to a second substrate, forming a bond between conductive areas on both substrates.

14 Claims, 2 Drawing Sheets

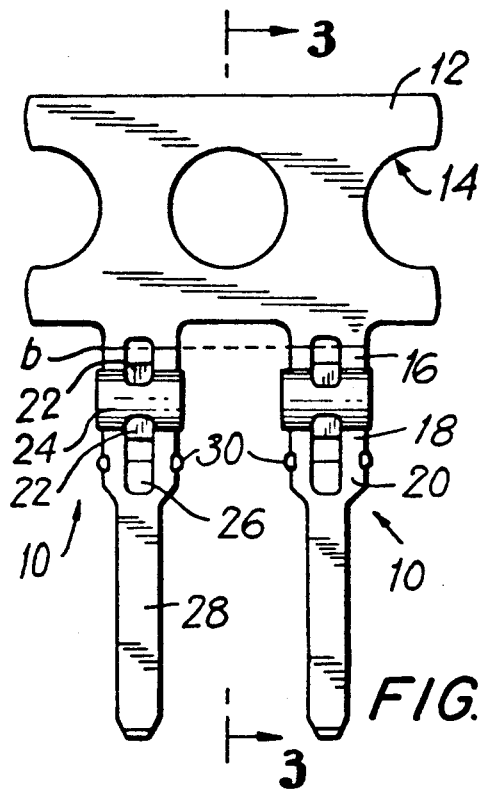
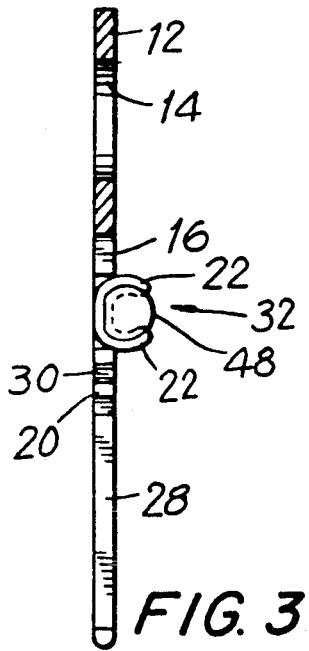
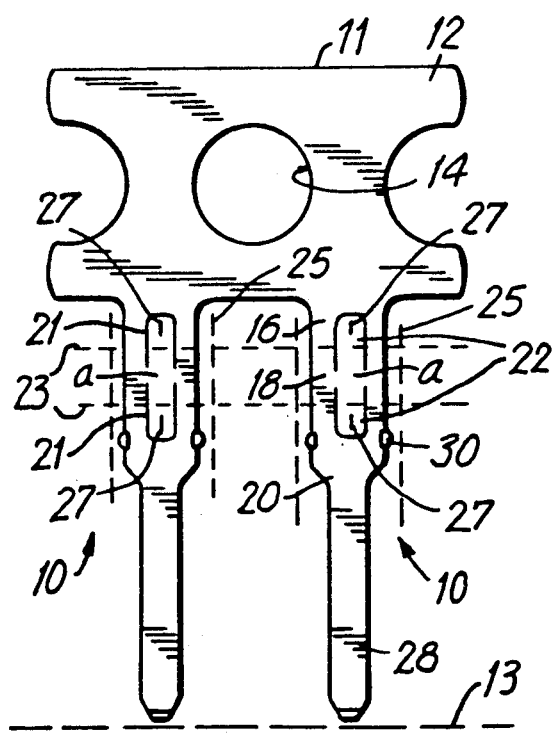
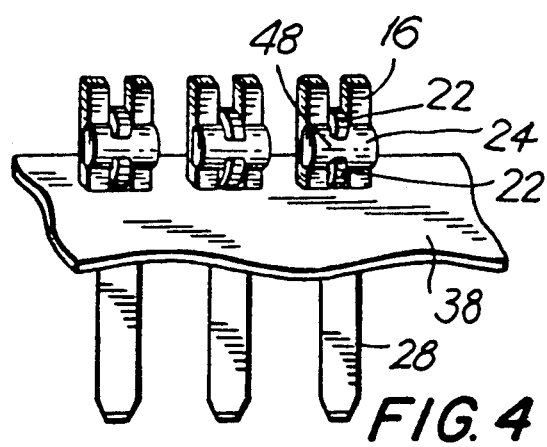
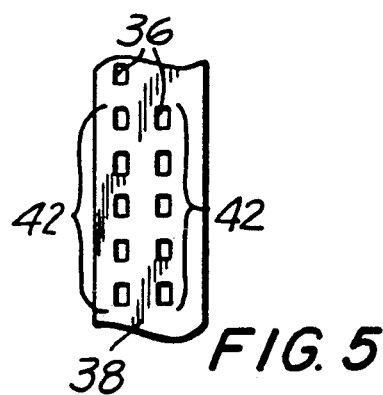

SOLDER-BEARING LEAD

The present application is a continuation-in-part of application Ser. No. 416,505, filed Oct. 3, 1989, U.S. Pat. No. 5,052,954 which is a continuation of application Ser. No. 129,715, now U.S. Pat,. No. 4,883,435, and is also related to U.S. Pat. No. 4,728,305, U.S. Pat. No. 4,679,889, and U.S. Pat. No. 4,605,278. The disclosure of the parent application, Ser. No. 416,505 is incorporated herein by reference.

BACKGROUND OF THE INVENTION

This invention relates to a solder-bearing lead for attachment to a substrate or integrated circuit chip or other circuit device, having a discrete mass of solder mechanically held by the lead in position to be melted for connecting the lead to the circuit device with both an electrical and mechanical bond. The invention also relates to a dual solder-bearing lead arrangement for attachment to an insulated holder, or substrate, and having a terminal pin arrangement for subsequent attachment to another substrate or a chip for connecting them to one another.

The lead of the present invention is of a type which is capable of being continuously formed by a progressive stamping apparatus from a thin strip of metal at high speed, and because each lead mechanically holds its own discrete mass of solder, the leads may be produced individually or preferably are attached to a common carrier strip for automated machine insertion into mating receptacles in a substrate or holder or for application to the surface of a substrate.

Various means have been previously provided where a quantity of solder is associated with a lead so that when the lead is juxtaposed to a substrate (usually with a corresponding conductive surface area or pad with which the lead is to be connected), and the assembly is heated, the molten solder covers the juxtaposed surfaces of the lead and substrate to form, when cool, a soldered joint forming an electrical and mechanical connection between the lead and substrate.

In the prior art, in one form a solder mass or slug was associated with a lead by means of a metallurgical or mechanical bond between the solder and the lead, with the solder positioned with the lead between it and the conductive area in the substrate. This method suffered from inconsistent solder bonds because the molten solder was required to migrate to reach the junction between the lead and the region to which the lead was to be soldered.

In some arrangements the solder mass is held mechanically against the lead by various tabs or fingers, formed from the body of the lead. The present invention constitutes an improvement on such arrangements. Examples of such other arrangements may be seen in U.S. Pat. Nos. 4,120,558; 4,203,648; 4,592,617; 4,697,865; 4,728,305; 4,738,627; 4,883,435; 4,932,876.

SUMMARY OF THE INVENTION

The present invention provides a simply formed lead arrangement which securely holds a discrete mass of solder adjacent to a lead by means of mechanical attachment. Two portions in the form of short fingers or tabs extending from the body of the lead wrap partially around the mass of solder, together holding it firmly in position. A gap provided between the ends of these finger portions allows direct juxtaposition of the mass of solder to a conductive area of a substrate.

It is thus an object of the present invention to provide improved means and method for attaching securely a discrete solder mass to a lead in a purely mechanical manner.

It is a further object of the invention to provide a solder-bearing lead having its own supply of solder in a convenient location for forming a bond with a substrate conductive area.

It is another object of the invention to provide a solder and lead assembly which can be made by very simple and efficient stamping steps.

It is yet another object to provide a unitary set of improved solder-bearing leads mounted on a holder or base permitting ready soldering to corresponding conductive areas of a substrate or circuit device, and also ready connection to a printed circuit board or the like.

It is a still further object of the invention to provide certain improvements in the form, construction and arrangement of the parts whereby these and other objects may be effectively attained. The invention accordingly comprises an article of manufacture possessing the features, properties, and the relation of elements which will be exemplified in the following description.

BRIEF DESCRIPTION OF THE DRAWINGS

Practical embodiments of the invention are shown in the accompanying drawings wherein;

FIG. 1 represents a front view of a partially processed blank for forming the leads of the invention during the manufacturing process;

FIG. 2 represents a front view of two leads according to the invention attached to a conventional carrier strip;

FIG. 3 represents a side cross-sectional view of the lead shown in FIG. 2 seen along line 3—3;

FIG. 4 represents a fragmentary perspective view of a part of a row of leads according to the invention mounted on a lead holder;

FIG. 5 represents a top view of a portion of a holder showing, in small scale, two parallel rows of receptacles for receiving terminal pins forming part of the leads of the present invention;

DETAILED DESCRIPTION OF PREFERRED EMBODIMENTS

Figure 6:
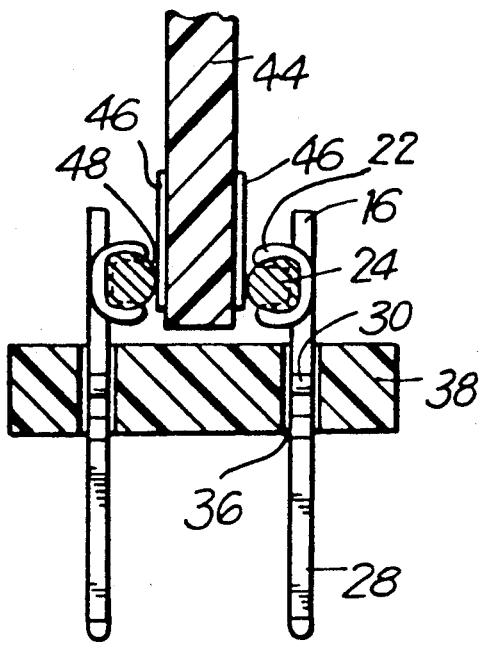
FIG. 6 shows a cross-sectional view of a holder for two parallel rows of leads according to the invention.

Referring to FIGS. 1 to 3, FIG. 1 shows a partially processed blank for the present invention, formed from a continuous strip of slightly resilient conductive material (e.g., beryllium copper or phosphor bronze) having one lateral edge 11 and a second edge at the position of dashed line 13. That strip is stamped or punched to form individual leads 10 connected to a common carrier strip 12 as shown. The carrier strip 12 may be provided with pilot holes 14 at regular intervals, as is conventional. The leads 10 are preferably spaced uniformly along strip 11, with a pitch which matches holes or receptacles in a substrate or holder on which the leads are to be mounted; the pitch illustratively may be 0.100 inch. Each lead 10 includes a terminal pin 28 and a body 18, with a top body section 16 joined to the carrier strip 12 and a lower body section 20.

The central portion of body 18 is formed with a pair of U-shaped cuts 21 with the open ends of the U cuts facing one another and leaving a central area a between the U-cuts. Each U-cut then forms a short finger or tab 22. Solder in the form of a wire or rod is then laid across the areas a as shown by dotted lines 23.

The carrier strip 12 may be any length desired, carrying a great number of leads 10. The leads 10 and carrier strip 12 are preferably formed by continuously and progressively stamping them from a thin strip of metal. During the stamping operation, the fingers 22 are bent out of the plane of the body 18 of the lead 10 and are wrapped partially around the discrete solder mass 24 to form the complete solder-bearing leads shown in FIGS. 2 and 3 (still integral with the carrier strip 12). During the stamping operation, when the free ends of the fingers 22 are wrapped around the soft metal of the solder, the fingers 22 may be indented into the surface of the solder to provide a firm mechanical attachment between the solder and the lead 10, which prevents the solder from becoming dislodged during shipping and handling, prior to the completion of the soldering operation. The fingers 22 do not completely surround the solder mass 24 but leave a gap 32 between the fingers 22 as seen in FIG. 3. The partially encircling engagement of the fingers 22 with the solder 24 creates a firm grip on the solder 24 during the various subsequent assembly and handling operations.

The solder wire or rod may then be cut, as along lines 25, to leave a solder mass or slug 24 held on each lead 10 by its tabs 22. The length of the solder slug 24 is designed to provide the volume of solder needed for a good soldered joint.

The body portion 18 also has a pair of small extensions or tabs 30, one on each edge, which as described below serve to cause a compressive fit with a hole or receptacle in a holder and may make contact with a conductive lining when provided in such a hole or receptacle.

In use, the terminal pin 28 of each lead 10 may be inserted into and soldered to an adjacent circuit board, may have a wire or other electrical component soldered to it, may serve as a pin or blade connector of an electrical plug, may serve as a lead connecting to sockets or other circuit components, may have a wire or wires conventionally wire-wrapped onto it, may function as a spring contact, or may have other electrical and mechanical connection where appropriate. It will be understood also that the pins 28 may be made as compliant pins, in the manner described in U.S. Pat. No. 4,932,876.

In one usage, each pin 28 is preferably of a size such as to permit it to pass into a receptacle 36 in a lead holder 38, shown in FIG. 6, with the largest cross-sectional dimension of the receptacle no larger than the largest cross-section dimension of the lower body portion 20. The protuberances 30 provide a friction fit between each lead body and its receptacle, to hold the leads in place in the holder during subsequent operations, such as insertion of the terminal pins 28 into corresponding receptacles or holes of another substrate, or making connections to pins 28. Where unnecessary or undesired, terminal pins 28 may be eliminated entirely.

FIGS. 1 to 3 illustrate the leads 10 connected to a carrier strip 12. While this is a preferred embodiment suitable for automated machine insertion of groups of leads into a holder or substrate, it is also possible, by virtue of the fact that each individual pin is firmly attached to its own solder mass, to use the leads individually, as might be desired by the user of small quantities of leads. Also individual ones or groups of leads 10 may be removed from the carrier strip 12 without disturbing the remainder of the leads, to allow a customized array of leads to be inserted as a unit into a corresponding array 42 of receptacles 36 in a holder 38 as seen in FIG. 5.

Figure 7:
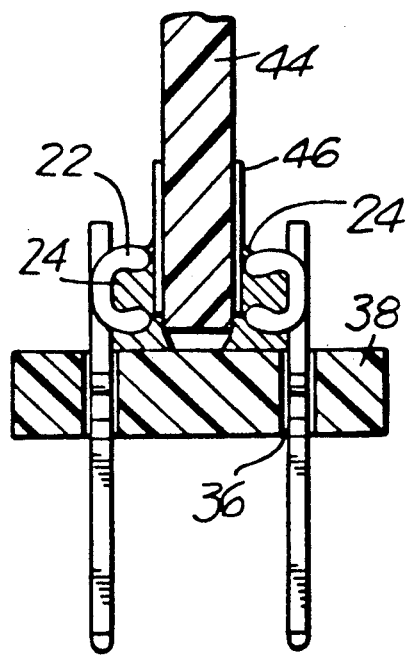
FIG. 7 shows a view as in FIG. 6 after soldering.

FIGS. 6 and 7 show a side sectional view of a holder 38 carrying two parallel rows of leads 10, two of which are shown in the figure. The two leads 10 shown are representative of two rows of leads 10 that are inserted, for example, in the two rows 42 of receptacles 36 shown in FIG. 5.

It can be seen that the lower body portion 20 has been sized to fit closely the receptacle 36 in the holder 38, while the tabs 30 extending from the edge of the lower body portion 20 form a compressive fit with the interior of the receptacle 36. When the leads are inserted into an insulating holder 38, the tabs 30 maintain a compressive fit with the holder, while either the fingers 22 or terminal pins 28 or both are connected to substrates or to other electronic components. It is contemplated by the invention that an assembly consisting of a holder 38 and a number of leads 10 could be soldered to one component at the fingers 22 and at a later time, another component could be soldered to the pins 28. The reverse sequence may also be used.

A module or substrate 44, which is intended for connection to the terminal pins 28, may be inserted between the opposed pair of leads 10. The substrate 44 may be any component having at least one conductive area or pad 46, such as an integrated circuit or chip carrier or printed circuit board. As seen from FIG. 6, as well as FIG. 3, the pair of fingers 22 leave an exposed portion 48 of the solder mass 24 at the gap 32 between the ends of the two fingers 22, facing away from the lead 10. This exposed solder portion 48 may be placed in direct juxtaposition with a corresponding conductive area 46 on the module substrate 44, as seen in FIG. 6. FIG. 7 shows a view similar to FIG. 6 after the soldering of the contact pads 46 to the fingers 22. On heating, solder will flow only around the fingers 22 and the conductive pad 46. The holder, formed of an insulating material, will tend to repel solder.

Figure 8:
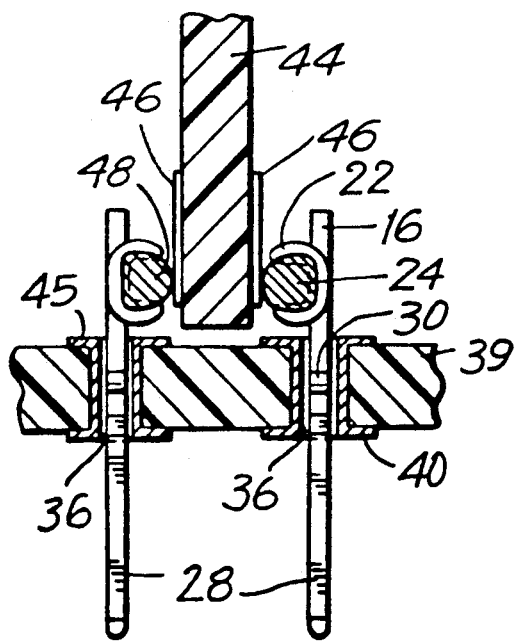
FIG. 8 represents a side and partial cross-sectional view of two leads according to the invention mounted in opposing arrangement on a holder or substrate, with a second substrate positioned between the terminals.
Figure 9:
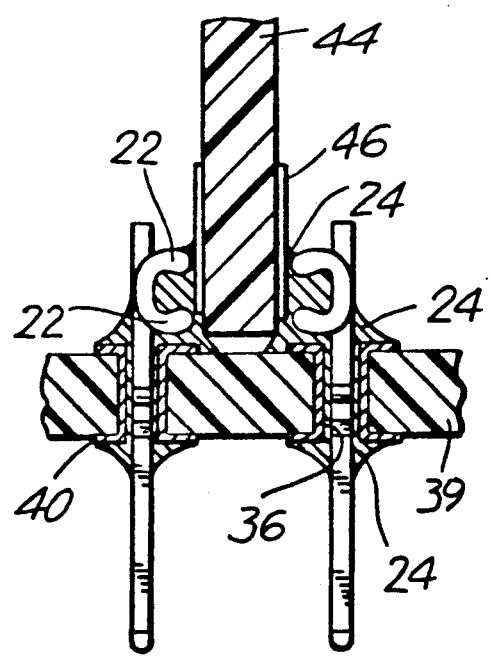
FIG. 9 represents a side and partial cross-sectional view of the assembly of FIG. 8 after the solder mass has melted and migrated to join conductive areas of the two substrates.

As shown in FIGS. 8 and 9, instead of holder 38, a substrate 39 may be supplied having contact pads, each with or without a connected conductive lining within the corresponding receptacle 36.

FIG. 8 shows a side sectional view of two leads 10 each inserted into a receptacle 36 in a substrate 39 which may be lined with a conductive contact material 40 in the vicinity of the receptacle 36 and on its interior surface. The compressive fit formed by tabs 30 engaging lining 40 contributes to good electrical contact between lead 10 and lining 40.

FIG. 8 also illustrates how the fingers 22 hold the solder 24 in close proximity or juxtaposition to the lower body portion 20, the conductive area 46, and the upper surface of the receptacle 36 prior to the application of heat and the completion of the soldering operation. The lower finger 22 in this figure may be juxtaposed to or adjacent to the conductive area 45 of substrate 38.

FIG. 9 is a detailed view of the metallurgical joint formed between the lead 10, the conductive area 46, and the receptacle 36 after the lead 10 and substrates 39,44 have been heating sufficiently to melt the solder 24. It can be seen that the solder 24 may flow around the lower body portion 20, bonding together both the upper and the lower surface portions of the contact material 40 on the substrate 39, the interior of the receptacle 36, the fingers 22, and the conductive area 46. The solder mass 24 is formed of a sufficient amount of solder, such that when the solder is heated and migrates to these various surfaces, the bond formed by the solder will be mechanically strong and electrically conductive to all the above-mentioned surfaces.

One or both of the fingers 22 may also have a slit or slot 27, shown in FIG. 1, to permit the solder to flow more readily around the finger 22 upon heating, to bond more firmly to the juxtaposed conductive area 46 on cooling.

In FIG. 1, a slot 26 can be seen, formed in the lower body portion 20 by bending finger 22 out of the body portion 20 during the stamping operation. The slot 26, the lower body portion 20 and the tabs 30 are correctly positioned and sized with respect to the thickness of the holder 38 or substrate 39 and the diameter of the receptacle 36 so that the body width at the tabs 30 is slightly over-sized with respect to the receptacle 36 prior to insertion. The slot 26 permits the width of the body portion to be resiliently compressed during insertion. This improves the compressive fit and stability of the lead 10 within the receptacle 36. As a result, a tight compressive fit is achieved after insertion, thereby making the lower part of lead 10 a compliant pin. This compliant pin portion produces a temporary mechanical bond between the lead 10 and the receptacle 36 which allows additional handling of the electrical assembly such as the insertion of other electrical components (e.g., a module substrate 44) or their testing prior to soldering, without fear that the previously inserted leads will become dislodged during such handling. The use of a compliant slot 26 in combination with tabs 30 to produce a compliant pin has additional advantages, including providing additional surface area in the lower body portion 20 for a better mechanical bond between the lower body portion 20 and the receptacle 36 and an improved electrical connection when receptacle 36 has a conductive lining.

FIGS. 3 and 6 show that the two fingers 22 preferably do not cover the portion of the surface of the solder mass 24 most remote from the body of the lead 10, so that a line drawn tangent to the solder mass 24 at its distal end from the lead 10, parallel to the lead 10, will not intersect the fingers 22. This avoids blocking the solder from contact with the conductive area 46 on the module substrate 44, which might lead to a diminished bond after solder melting and cooling. The leads 10 are at least slightly resilient, so that on insertion of substrate 44 between the rows of leads 10, as in FIG. 6 or 8, upon heating to melt the solder, the lead resiliency will urge the fingers 22 into contact with the substrate conductive pads 46, to improve their electrical connection. In practice, the solder mass 24 may be flush with the fingers 22. The gap 32 between the fingers 22 also allows a free flow route for the molten solder after heating. The width of the fingers 22 is also significantly smaller than the width of the solder mass 24, allowing molten solder to flow around the sides of the fingers 22 as well.

It will thus be seen that the objects set forth above, among those made apparent from the preceding description, are efficiently attained and, since certain changes may be made in the above article without departing from the spirit and scope of the invention, it is intended that all matter contained in the above description and shown in the accompanying drawings shall be interpreted as illustrative and not in a limiting sense.

What is claimed is:

1. A solder-bearing lead for soldering to a conductive area of a substrate, comprising:

an elongated body, and a solder mass, said body having two U-shaped cuts to define two fingers in a medial region of said body, each of said fingers having a first end integral with and attached to said body at said medial region and also having a free end, said first integral ends of said fingers being substantially adjacent each other with said U-shaped cuts extending in opposite directions away from a predetermined position along said body medial region with the open ends of the cuts being on opposite sides of said position and with said fingers extending in opposite directions from said position, whereby the width of each finger may be formed independently of the other, said fingers being bent out of the plane of said body and each having a portion spaced from said body;

said fingers encircling at least a portion of said solder mass, with a gap between the free ends of said fingers, said solder mass being positioned against said body at said position and remaining uncovered by said fingers at said gap, whereby, upon facing and directly juxtaposing said uncovered solder mass portion to said substrate conductive area and melting said solder, the solder is caused to flow unobstructedly into contact with said conductive area to solder said lead to said conductive area.

2. A lead as in claim 1, wherein the proximal ends of said finger-like portions are beneath said solder mass.

3. A lead as in claim 2, wherein said proximal ends of said finger-like portions are adjacent the opposite side of said solder mass from said gap.

4. A solder-bearing lead adapted to be held in a lead-receiving opening in a holder and to be soldered to a conductive area on a substrate, said lead comprising:

an elongated body having an upper body portion and a lower body portion, said lower body portion being sized to fit in said holder opening substantially perpendicular to said holder, said body having two U-shaped cuts to define two fingers, each of said fingers having a first end integral with and attached to said body and also having a free end, said first internal ends of said fingers being substantially adjacent each other with said U-shaped cuts extending in opposite directions from a predetermined position along said body, said fingers being bent out of the plane of said body and each having a portion spaced from and in opposition to said body;

a solder mass;

said fingers being bent around said solder mass with said solder mass held between fingers, said finger free ends being wrapped only partially around said solder mass to leave at least a portion of said solder mass uncovered by said fingers;

said uncovered solder mass portion being in a position to confront directly and to contact said substrate conductive area with the free ends of said fingers adjacent to said conductive area;

and with one of said fingers being interposed between said solder mass and said holder.

5. A lead as in claim 4, wherein said fingers are indented into the surface of the mass of solder for holding the mass securely in position.

6. A lead as in claim 4, wherein the lead has a lower terminal portion attached to and substantially axially aligned with the lower body portion, said lower terminal portion being at least as small in its thickness and width as the lower body portion to allow the lower terminal portion to pass through the opening in said holder.

7. A lead as in claim 6, wherein said lower body portion has a protuberance at each edge designed to contact the inner wall of said holder opening.

8. A method of soldering a lead to a conductive area of a substrate, comprising the steps of:

providing a solder-bearing lead as in claim 1;

placing said lead on aid substrate with said solder mass between said substrate conductive area and said body and with said substrate conductive area juxtaposed to and directly confronting said uncovered solder mass and said fingers; and applying heat to melt said solder mass, whereby on cooling said lead is soldered to said conductive area.

9. A method as in claim 8 wherein each of said fingers is formed by a U-shaped cut in said body.

10. A method as in claim 9 wherein said U-shaped cut is substantially centrally of said body and between spaced lateral portions of said body.

11. A method of producing a lead for soldering to a conductive area of a substrate, comprising the steps of:

forming a conductive elongated body, said body having two fingers extending oppositely and longitudinally from a predetermined location along said body, each finger having a first end attached to said body at said predetermined location along said body, and each finger also having a free end spaced from said location;

applying a solder mass against said body at said location;

bending said fingers around said solder mass to wrap them only partially around said solder mass with a portion of said solder mass uncovered between the free ends of said bent fingers;

providing ah older, said holder having a plurality of receptacles, one of said receptacles being dimensioned to receive and frictionally engage said lead;

placing said lead within said one receptacle, such that said lead will be immobile with respect to said holder.

12. A method of producing an assembly of leads for soldering to conductive areas of a substrate, comprising the steps of:

providing a plurality of leads as in claim 1;

providing a holder, said holder having a plurality of receptacles, each of said receptacles being dimensioned to receive and frictionally engage a respective one of said leads; and placing said plurality of leads into said receptacles, such that said leads will be immobile with respect to said holder.

13. A method of producing a lead for subsequent soldering to a conductive area of a substrate, comprising the steps of:

forming a conductive elongated body, forming a U-shaped cut at one portion of said body to define a first finger having a first end integral with and attached to said body at a position intermediate the ends of said body and also having a free end, forming a second U-shaped cut on said body adjacent to but spaced longitudinally from said position and the open end of said second cut being on an opposite side of said position from the open end of said first U-shaped cut, to define a second finger having a first end integral with and attached to said body and also having a free end, said U-shaped cuts extending in opposite directions away from said position, placing a solder mass on said body at said position, bending said fingers out of the plane of said body around said solder mass to hold said solder mass between said fingers, with said finger ends wrapped only partially around said solder mass to leave at least a portion of said solder mass uncovered by said fingers, whereby said uncovered solder mass portion is in a position to confront directly and to contact a substrate conductive area with the free ends of said fingers adjacent to said conductive area.

14. A method as in claim 13, further comprising the steps of:

heating said solder mass to cause it to flow over said conductive area, and cooling said solder to solder said lead to said area.

* * * * *